(12) United States Patent
Kim

(10) Patent No.: US 10,418,386 B2
(45) Date of Patent: Sep. 17, 2019

(54) OPTICAL RECEIVER USING WAVELENGTH TUNABLE FILTER

(71) Applicant: PHOVEL. CO. LTD., Daejeon (KR)

(72) Inventor: Jeong-Soo Kim, Gongju-si (KR)

(73) Assignee: PHOVEL. CO. LTD, Yuseong-Gu, Daejeon (KR)

( * ) Notice: Subject to any disclaimer, the term of this patent is extended or adjusted under 35 U.S.C. 154(b) by 0 days.

(21) Appl. No.: 14/889,488

(22) PCT Filed: May 13, 2014

(86) PCT No.: PCT/KR2014/004245
§ 371 (c)(1),
(2) Date: Nov. 6, 2015

(87) PCT Pub. No.: WO2014/208892
PCT Pub. Date: Dec. 31, 2014

(65) Prior Publication Data
US 2016/0112776 A1  Apr. 21, 2016

(30) Foreign Application Priority Data

Jun. 26, 2013 (KR) .................. 10-2013-0073896
Aug. 9, 2013 (KR) .................. 10-2013-0094626
Oct. 4, 2013 (KR) .................. 10-2013-0118621

(51) Int. Cl.
*G02F 1/01* (2006.01)
*G02F 1/21* (2006.01)
(Continued)

(52) U.S. Cl.
CPC .......... *H01L 27/124* (2013.01); *G02F 1/1345* (2013.01); *G02F 1/13458* (2013.01);
(Continued)

(58) Field of Classification Search
CPC ....... H04Q 11/0005; H04Q 2011/0009; H04Q 2011/0018
See application file for complete search history.

(56) References Cited

U.S. PATENT DOCUMENTS 5,301,058 A * 4/1994 Olshansky ............ G02F 1/0327
                                                          359/246
6,262,834 B1 * 7/2001 Nichols .................. G02F 1/225
                                                          359/238
(Continued)

FOREIGN PATENT DOCUMENTS

CN    101655578 A    2/2010
CN    102650553 A    8/2012
KR    1020100030486 A    3/2010

OTHER PUBLICATIONS

Chinese Office Action issued in corresponding Chinese Patent Application No. 201480030261.6 dated Mar. 1, 2017.

*Primary Examiner* — Mina M Shalaby
(74) *Attorney, Agent, or Firm* — Michael J. Bujold

(57) ABSTRACT

An optical receiver that can tune a selected wavelength using a wavelength tunable filter transmitting a plurality of wavelengths. The optical receiver is a wavelength tunable optical receiver that includes: a wavelength tunable filter (100) transmitting laser light from an optical fiber; and a photodiode (300) receiving laser light passing through the wavelength tunable filter (100), in which the wavelength tunable filter 100 is a Fabry-Perot type etalon filter transmitting a plurality of wavelengths. When a channel with a specific wavelength is moved to a channel with another wavelength, an optical channel is selected based on a peak different from a transmissive peak of an FP etalon filter selecting the previous channel so that temperature of the wavelength tunable filter can be changed. A light-receiving photodiode chip is disposed on a thermoelectric element and
(Continued)

a wavelength tunable filter transmits different wavelengths in accordance with temperature of the thermoelectric element.

20 Claims, 6 Drawing Sheets

(51) Int. Cl.
    *H01L 27/12*     (2006.01)
    *G02F 1/1345*     (2006.01)
    *G02F 1/1362*     (2006.01)
    *G09G 3/36*     (2006.01)

(52) U.S. Cl.
    CPC ......... *G02F 1/136286* (2013.01); *G09G 3/36* (2013.01); *G09G 3/3648* (2013.01); *H01L 27/1218* (2013.01); *H01L 27/1244* (2013.01); *H01L 27/1248* (2013.01); *G02F 2001/13629* (2013.01); *G09G 2300/0408* (2013.01); *G09G 2300/0426* (2013.01); *G09G 2320/0209* (2013.01); *G09G 2320/0223* (2013.01)

(56) References Cited

U.S. PATENT DOCUMENTS

| | | | |
|---|---|---|---|
| 6,985,281 B2 | 1/2006 | Wagner et al. | |
| 7,265,712 B2* | 9/2007 | Merkel | G01S 7/288 342/195 |
| 2003/0202799 A1 | 10/2003 | Zhou et al. | |
| 2005/0211875 A1* | 9/2005 | Kawanishi | G02F 1/2255 250/208.1 |
| 2007/0041735 A1* | 2/2007 | Darcie | H04B 10/032 398/186 |
| 2007/0201881 A1 | 8/2007 | Douma | |
| 2007/0258722 A1 | 11/2007 | Yu | |
| 2008/0205887 A1 | 8/2008 | Murano et al. | |
| 2008/0260335 A1* | 10/2008 | Laitala | G01N 21/251 385/115 |
| 2009/0116838 A1 | 5/2009 | Kihara | |
| 2009/0214223 A1* | 8/2009 | Chen | H04B 10/00 398/183 |
| 2009/0279825 A1* | 11/2009 | Kawanishi | G02F 1/225 385/2 |
| 2009/0297155 A1* | 12/2009 | Weiner | H04B 1/40 398/115 |
| 2009/0324251 A1* | 12/2009 | Ilchenko | G02F 1/011 398/183 |
| 2010/0008680 A1* | 1/2010 | Chen | H04B 10/505 398/198 |
| 2010/0014872 A1* | 1/2010 | Fu | H04B 10/25137 398/158 |
| 2010/0142963 A1* | 6/2010 | Monroy | H04B 1/24 398/115 |
| 2011/0110387 A1* | 5/2011 | Maleki | H01S 5/0687 372/20 |
| 2011/0299849 A1* | 12/2011 | Klotz | H04B 10/073 398/26 |
| 2012/0141141 A1* | 6/2012 | Bulot | H04B 10/505 398/182 |

* cited by examiner

[FIG. 1] PRIOR ART
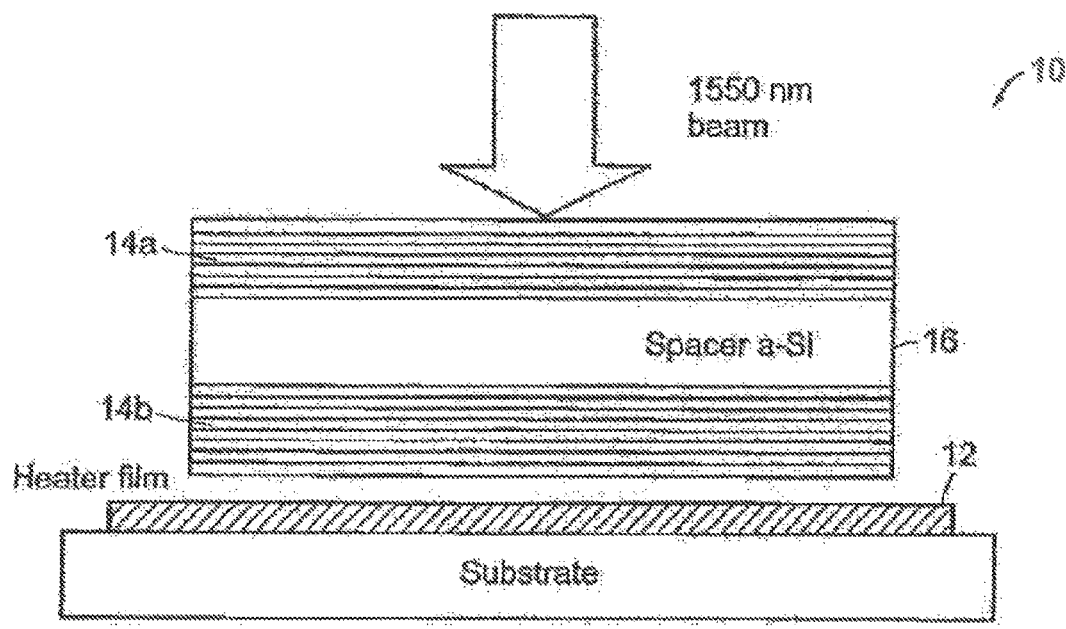
[FIG. 2]
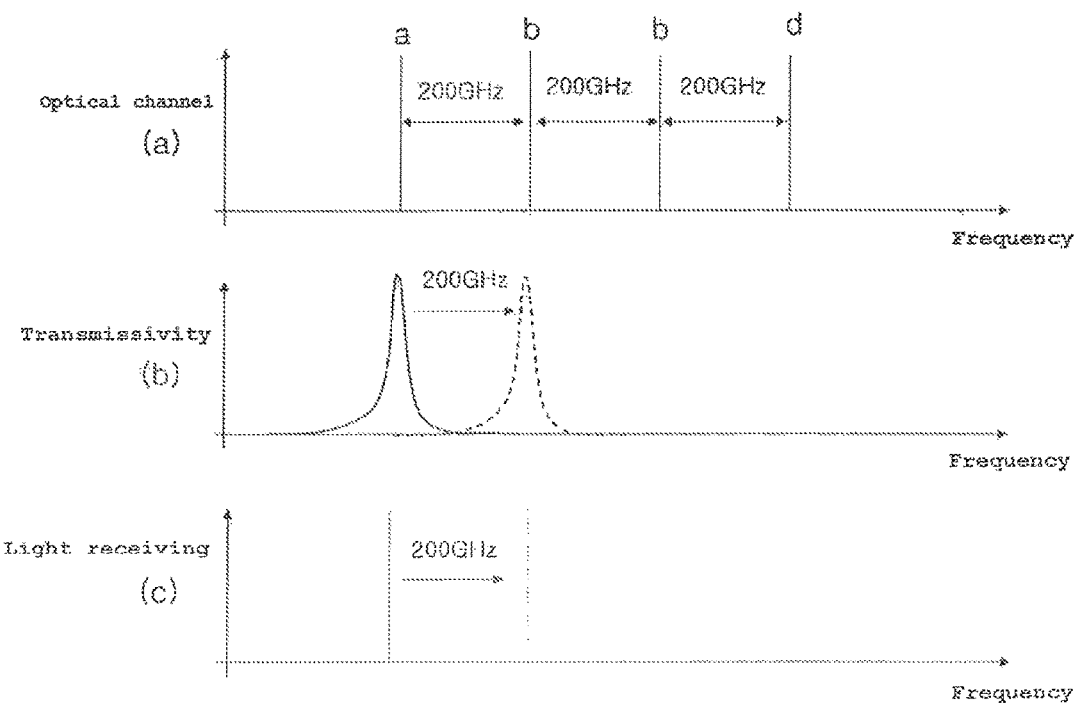

[FIG. 3]
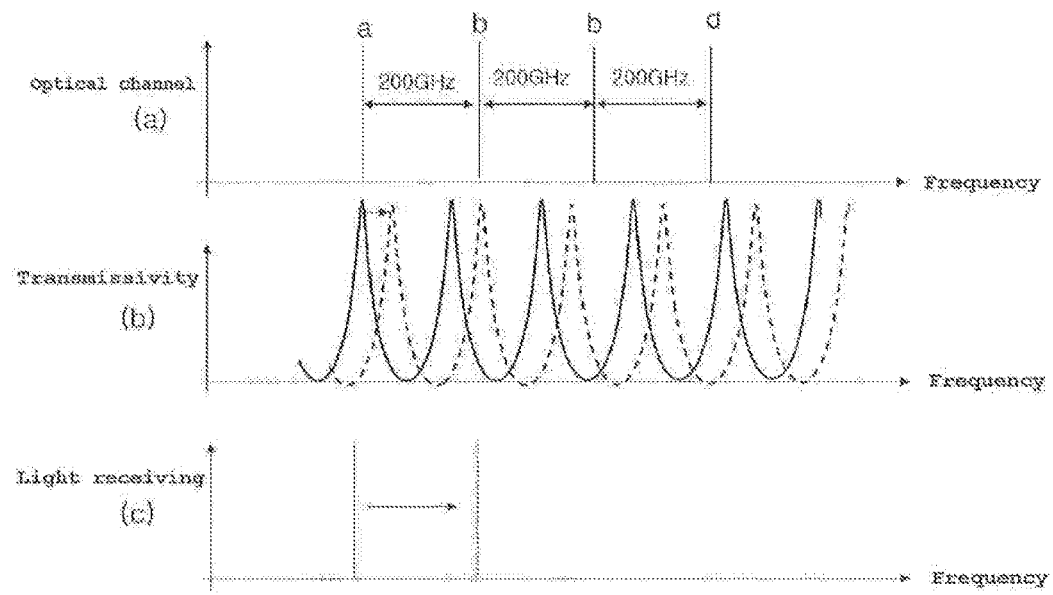
[FIG. 4]
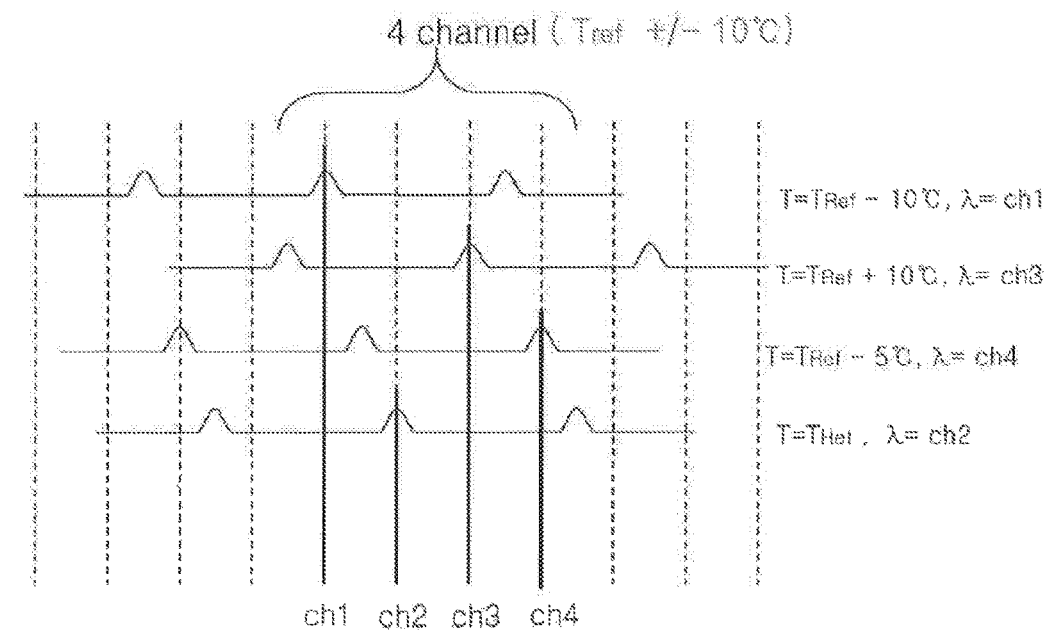

[FIG. 5]
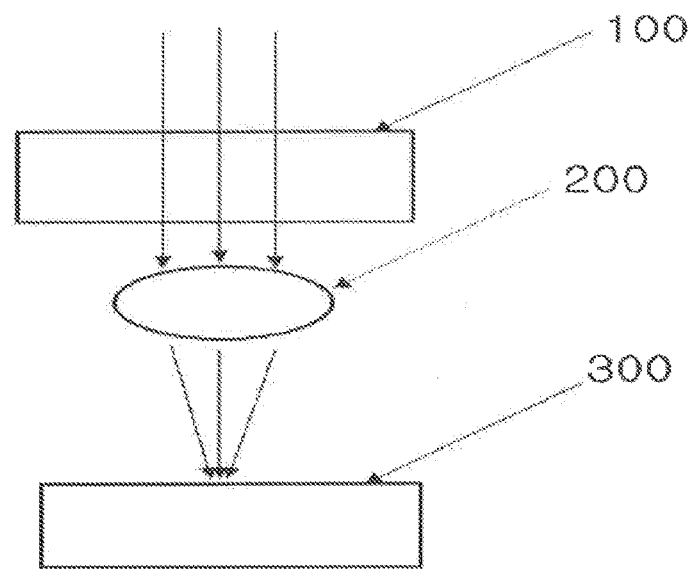
[FIG. 6]
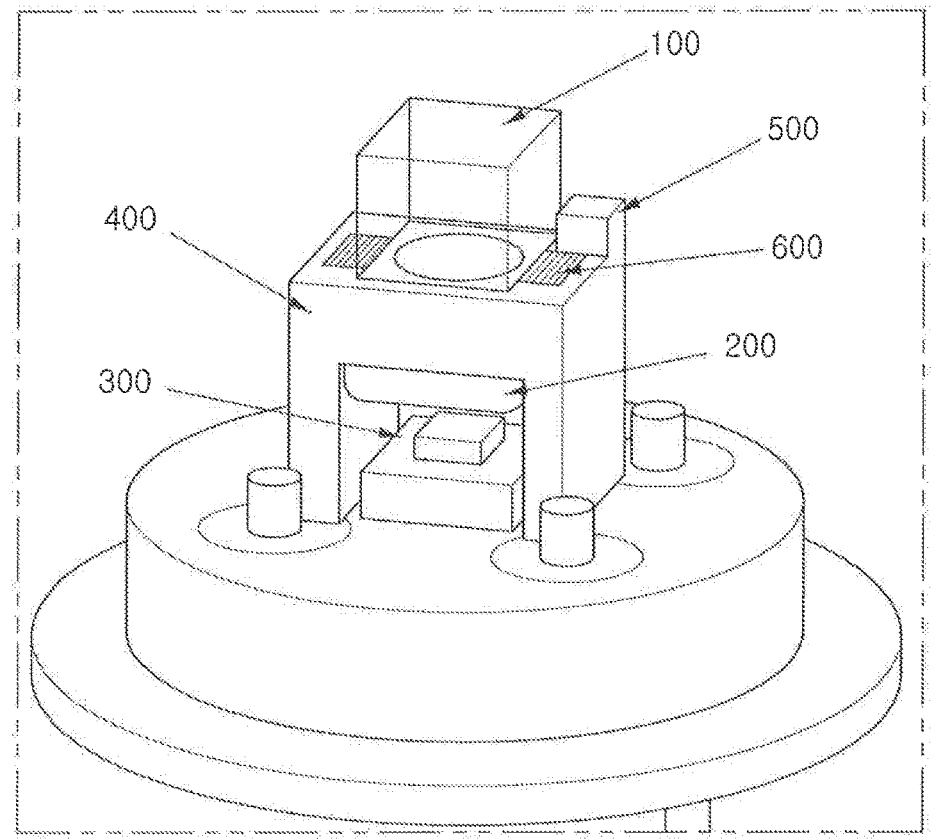

[FIG. 7]
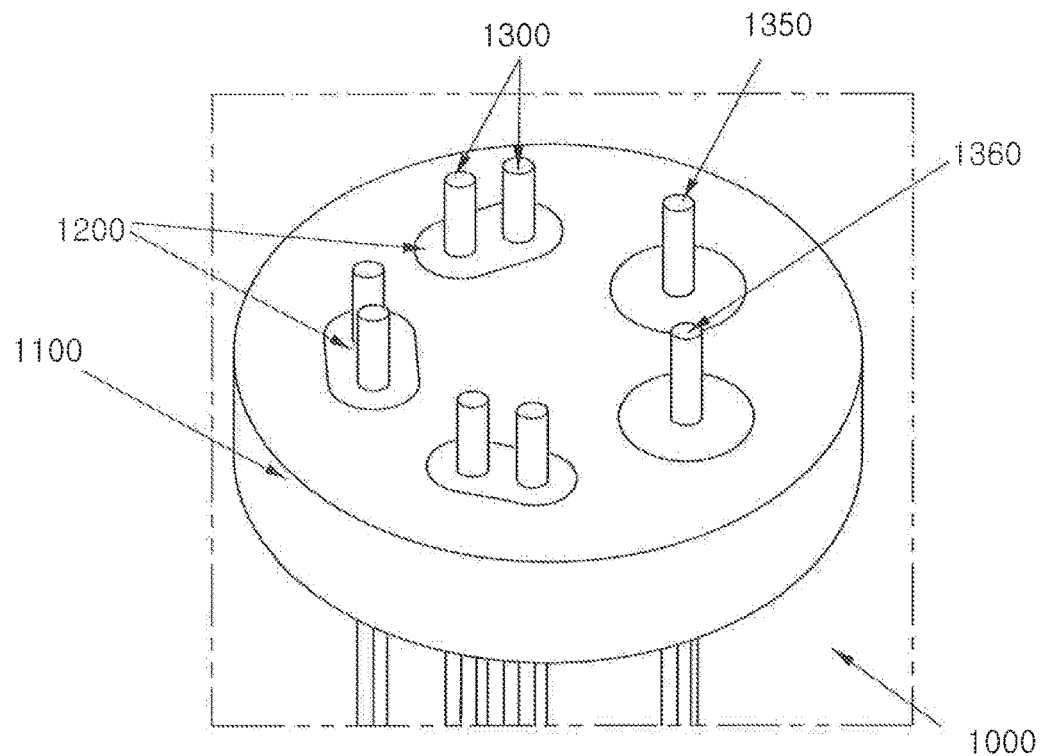
[FIG. 8]
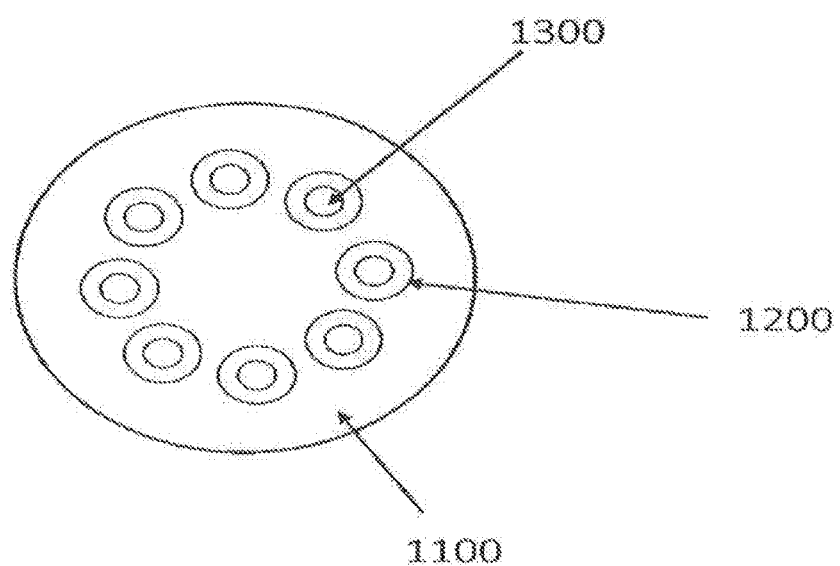

[FIG. 9]
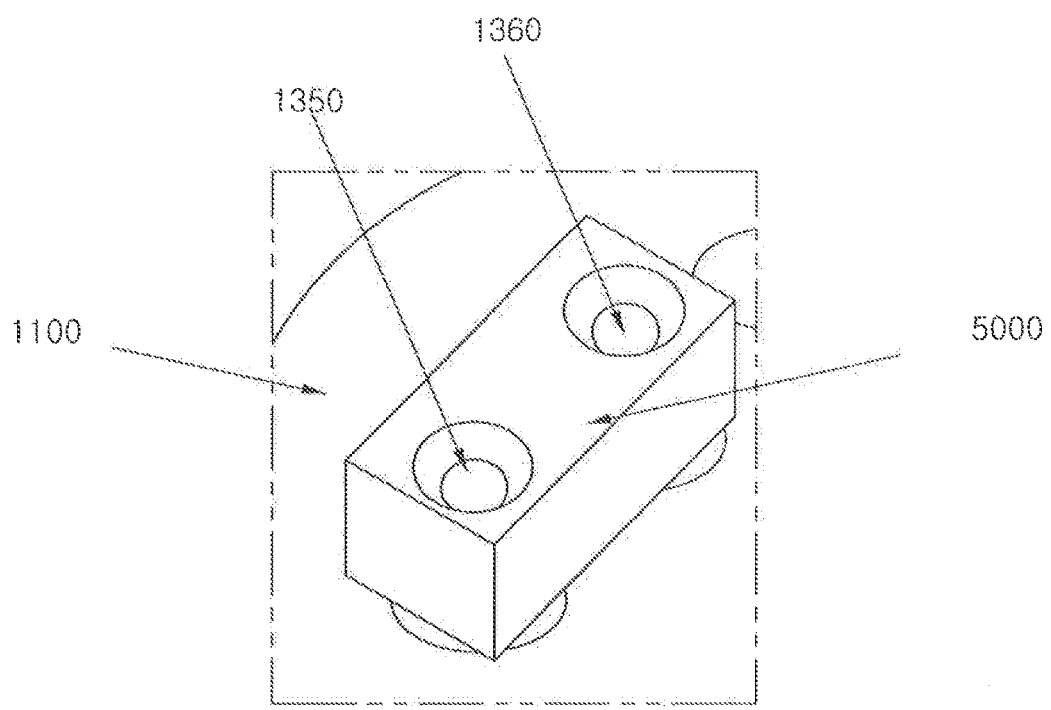

[FIG. 10]
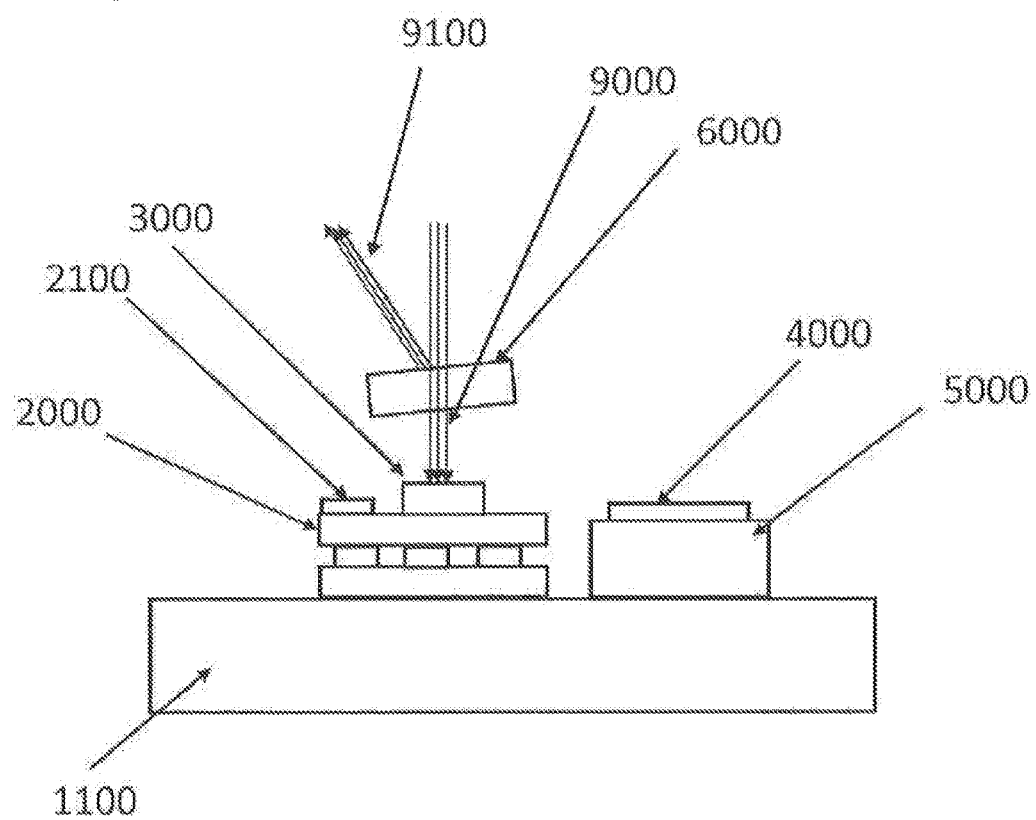

OPTICAL RECEIVER USING WAVELENGTH TUNABLE FILTER

TECHNICAL FIELD

The present invention relates to an optical receiver using a wavelength tunable filter that can tune a selected wavelength using a wavelength tunable filter transmitting a plurality of wavelengths.

BACKGROUND ART

Recently, communication services with large communication capacity, including video service for smart-phones, have been provided. Accordingly, there is a need for greatly increasing the existing communication capacity and a DWDM (Dense Wavelength Division Multiplexing) type communication has been adopted to increase communication capacity using optical fibers that were installed already. The DWDM type communication simultaneously transmits light having several wavelengths through one optical fiber, using a phenomenon that light signals having several wavelengths do not interfere with each other even if they are simultaneously transmitted through one optical fiber, because laser lights having different wavelengths do not interfere with each other.

At present, NG-PON2 (Next Generation-Passive Optical Network version2) is internationally under consideration as a standard and NG-PON2 sets four channel wavelengths for downward optical signals for subscribers from stations. The wavelength spacing of the four channels is set to 100 GHz or 200 GHz.

Under NG-PON2, one subscriber is supposed to select and receive one wavelength, in which it is possible to receive a downward optical signal by inputting a channel optical signal having a specific wavelength to an optical receiver, using a fixing device separating wavelengths. However, an optical line is not dynamically assigned to the optical receiver that separates specific fixed wavelengths to optical fibers and receives light regardless of the type of the wavelength coupled to specific optical fibers, so it is difficult to manage optical lines.

In order to solve this problem, wavelength tunable optical receivers that can dynamically determine a reception wavelength have been developed. As wavelength tunable filter used in the wavelength tunable optical receivers, filters that transmit only specific wavelengths by alternately depositing amorphous silicon and SiO2 on a glass substrate are generally used.

FIG. 1 illustrates a wavelength tunable filter employed in U.S. Pat. No. 6,985,281. The wavelength-tunable filter in the US patent transmits only specific wavelengths by alternately depositing amorphous silicon and $SiO_2$ on a glass substrate used in this art. In this US patent, the amorphous silicon used as a spacer has a change in refraction index according to temperature of about $10^{-4}$, so when a wavelength-selective filter is changed in temperature about 1° C., the frequency of light passing through the wavelength-selective filter changes by about 10 GHz. The wavelength tunable filter has only one transmissive peak in a wavelength band of dozens of nanometers, so amorphous silicon used as a spacer in FIG. 1 should be manufactured with a precise thickness to make the filter correspond to predetermined four-wavelength channel. However, it is very difficult to adjust the thickness of amorphous silicon, so when a wavelength tunable filter is usually manufactured with a difference of several nanometers from a desired wavelength, so it is difficult to manufacture a wavelength tunable filter.

Meanwhile, NG-PON2 standard proposes an APD (avalanche photo diode) as a light receiving element that receives an optical signal having a wavelength passing through a wavelength tunable filter. Further, a wavelength tunable optical receiver should receive high-speed signals in 10 Gbps class, so it should be manufactured such that signal distortion is not generated. In order to receive well signals in 10 Gpbs class, RF impedance for a signal transmission line of a package should be matched well so that the signal transmission line receives well signals in 10 Gbps class. The wavelength tunable filter transmits different wavelength, depending on a change in temperature, so it is required to change the temperature of the wavelength tunable filter in order to tune and receive a specific wavelength.

In FIG. 1 illustrating the US patent, it is possible to adjust the temperature of a wavelength tunable filter using a heater formed in a thin film type in the wavelength tunable filter. However, when the heater is used, the temperature can be easily increased, but is manually decreased by dissipating heat, so it is difficult to adjust time to decrease the temperature.

Further, it is required to adjust the temperature of a wavelength tunable filter at least at a temperature higher than the temperature of the external environment in order to change and keep the temperature of the wavelength tunable filter at a predetermined level using a heater. Accordingly, when the temperature of the external environment changes up to 85° C., it is required to adjust the transmissive wavelength of a wavelength tunable filter by changing the temperature of the wavelength tunable filter at least over 85° C., preferably 105° C. NG-PON2 requires tuning of 2.4 nm wavelengths, so a wavelength tunable filter should be operated at least within 105 to 13° C. However, this temperature is very high and causes a problem with temperature stability of a polymeric adhesive such as epoxy, so epoxy cannot be used when a wavelength tunable filter is assembled.

A communication system under NG-PON2 requires an inexpensive optical element and a TO (transistor outline) type package is used as an inexpensive optical element package. The TO type package is composed of a stem in which electrode pins insulated and sealed by glass are inserted in a plurality of through-holes, and a cover that covers optical parts on the stem.

PRIOR ART DOCUMENT

Patent Document 1

U.S. Pat. No. 6,985,281 (2006 Jan. 10)

DISCLOSURE

Technical Problem

The present invention has been made in an effort to solve the problems in the related art and an object of the present invention is to provide a wavelength tunable optical receiver that has a plurality of transmissive peaks using an etalon filter.

In particular, an object of the present invention is to provide a wavelength tunable optical receiver that uses an inexpensive TO type package and can be manufactured in a size that can be mounted on a standardized SFP transceiver case in the related art.

Further, an object of the present invention is to provide a TO type wavelength tunable optical receiver that can tune a wavelength, easily adjust temperature of a wavelength tunable filter, perform super-high speed communication, and be manufactured at a low cost.

Technical Solution

A wavelength tunable optical receiver according to the preset invention for achieving the objects includes: a wavelength tunable filter transmitting laser light from an optical fiber; and a photodiode receiving laser light passing through the wavelength tunable filter, in which the wavelength tunable filter is a Fabry-Perot type etalon filter transmitting a plurality of wavelengths.

A cross-sectional reflectance of the wavelength tunable filter (100) is 80 to 99%, preferably 85 to 95%.

Further, when the number of optical channels is n, it is preferable that a frequency spacing of the wavelength tunable filter is determined by (n/(n+1)×optical channel frequency spacing) or ((n+2)/(n+1)×optical channel frequency spacing), in which the frequency spacing of the wavelength tunable filter may be different by ±10% from the determined frequency spacing. Further, when the number of optical channels is n, a frequency spacing of the wavelength tunable filter may be determined by (n+1)×optical channel frequency spacing/2), in which the number of channels, n is preferably 4 or 8.

Meanwhile, the wavelength tunable filter may be adjusted in temperature by a heater or a thermoelectric element.

Further, a lens concentrating light passing through the wavelength tunable filter to a light receiving area of a photodiode may be further provided.

The wavelength tunable filter may have a reflective film formed by stacking dielectric thin films having high and lower refractive indexes on both sides of a semiconductor substrate including any one of silicon, InP, and GaAs.

Meanwhile, a perpendicular line to a cross-section of the wavelength tunable filter where laser light reaches and incident laser light make an angle of 0.2 to 2° therebetween, in which the angle is preferably 0.4 to 1°.

An isolator transmitting light in only one direction may be disposed between the optical fiber and the wavelength tunable filter.

Meanwhile, the wavelength tunable filter may be disposed on the upper surface of a bridge pier-shaped stand and the photodiode may be disposed under the bridge pier-shaped stand. Further, a lens concentrating light passing through the wavelength tunable filter to a light receiving area of the photodiode may be disposed on the lower surface of the bridge pier-shaped stand.

Further, a thin heater film adjusting temperature of the wavelength tunable filter may be disposed on the upper surface of the bridge pier-shaped stand, and a thermistor measuring temperature of the wavelength tunable filter may be disposed at a side on the upper surface of the bridge pier-shaped stand.

A wavelength tunable optical receiver according to the present invention for achieving the objects includes: a wavelength tunable filter transmitting laser light from an optical fiber; and an APD (avalanche photo diode) chip having a high operation speed in 10 Gbps class and receiving laser light passing through the wavelength tunable filter, a TIA (Trans impedance) chip, a thermoelectric element, and a thermistor measuring temperature of the thermoelectric element, in which the wavelength tunable filter is adjusted in temperature by the thermoelectric element.

The wavelength tunable filter may have a reflective film formed by stacking dielectric thin films having high and lower refractive indexes on both sides of a semiconductor substrate including any one of silicon, InP, and GaAs.

The wavelength tunable filter, the APD chip, and the thermoelectric element are manufactured using a TO type package having seven or more insulated electrode pins sealed by at least five or more glass sealers, in which at least two or more electrode pins are independently combined with a stem of the TO type package by the glass sealers, and at least two or more electrode pins are matched at 50 ohm in impedance.

An electrode pin protruding in a TO can type package of electrodes matched in impedance of 50 ohm is surrounded by a metal stand and matched at 50 ohm in impedance.

The APD chip and the wavelength tunable filter are disposed on a thermoelectric element and the TIA chip is disposed on the metal stand.

Advantageous Effects

The wavelength tunable filter applied to an optical receiver according to the present invention is manufactured by very precisely adjusting the thickness of a semiconductor substrate made of silicon for example and then coating a reflective film on both sides of the substrate, so a wavelength is very easily adjusted. That is, when the US patent illustrated in FIG. 1 is applied to four-channel optical communication having a frequency spacing of 200 GHz, at least 600 GHz transmissive frequency should be adjusted, so it is possible to tune any one of four channels to the previous channel by changing the temperature at least by 60° with a transmissive frequency adjusted. However, the wavelength tunable filter according to the present invention can perform tuning to a predetermined channel of other three optical channels by adjusting a transmission frequency by 150 GHz when any one channel is tuned, so it is possible to achieve the same effect as the US patent only by changing temperature by 15° C.

Further, according to the US patent, it is very difficult to adjust the thickness of the spacer layer in FIG. 1 and an error of 1,000 to 2,000 GHz is generated from a desired frequency in many cases; however, according to the present invention, there is no frequency difference of 100 GHz or more in any cases, so it is very easy to manufacture and operate a filter.

Further, the wavelength tunable filter based on temperature is adjusted in temperature by a thermoelectric element, so a quick wavelength tunable characteristic can be achieved. Furthermore, the impedance of a TO type package signal wire is matched at 50 ohm with the impedance of not only the portions sealed by glass sealers in a TO stem, but the electrode pin portion protruding in the TO package, so the signal transmission characteristic is high. In addition, a TIA chip is disposed on a metal stand, so the distance from an APD chip disposed on a thermoelectric element is minimized, so the signal transmission characteristic is high.

DESCRIPTION OF DRAWINGS

FIG. 1 illustrates an example of a wavelength tunable filter that is applied to an optical receiver of the related art.

FIG. 2 is a conceptual diagram illustrating a process of selecting a desired optical channel in an optical receiver using a wavelength tunable filter of the related art.

FIG. 3 is a conceptual diagram illustrating a process of selecting a desired optical channel in an optical receiver using a wavelength tunable filter according to the present invention.

FIG. 4 is a conceptual diagram illustrating a process of selecting a desired optical channel in an optical receiver using a wavelength tunable filter in accordance with another embodiment of the present invention.

FIG. 5 is a conceptual diagram illustrating a process of receiving laser light in an optical receiver having a wavelength tunable filter according to the present invention.

FIG. 6 is a three-dimensional structural view of an optical receiver using a wavelength tunable filter according to an embodiment of the present invention.

FIG. 7 illustrates a stem structure having a plurality of electrode pins according to an embodiment of the present invention.

FIG. 8 is a view illustrating the structure of a wavelength tunable optical receiver having a built-in thermoelectric element according to an embodiment of the present invention.

FIG. 9 illustrates a stem structure when eight electrode pins are sealed with a glass sealer.

FIG. 10 is a conceptual diagram illustrating a process of inserting a signal transmission electrode pin into a through-hole formed in a metal stand in order to match impedance of an exposed portion of a signal electrode pin according to an embodiment of the present invention.

DESCRIPTION OF MAIN REFERENCE
NUMERALS OF DRAWINGS

100: Wavelength tunable filter
200: Lens
300: Photodiode
400: Bridge pier-shaped stand
500: Thermistor
600: Thin heater film
1000: Stem
1100: Stem base
1200: Glass sealer
1300: Electrode pin
1350: Electrode pin for TIA chip data
1350: Electrode pin for TIA chip data bar
2000: Thermoelectric element
2100: Thermistor
3000: APD (avalanche photo diode) chip
4000: TIA (Trans impedance amplifier) chip
5000: Metal stand with holes therein
6000: Wavelength tunable filter transmitting different wavelengths in accordance with temperature
9000: Light passing through wavelength tunable filter
9100: Light reflecting from wavelength tunable filter

DETAILED DESCRIPTION OF THE
PREFERRED EMBODIMENT

Preferred embodiments not limiting the present invention will be described hereafter in detail with reference to the accompanying drawings.

FIG. 2 is a conceptual diagram illustrating a wavelength tunable characteristic of an optical receiver using a wavelength tunable filter of the related art. In FIG. 2, in order to help understanding the present invention, an optical channel has a four-channel wavelength is used, and the channel frequency spacing is exemplified as 200 GHz, and four optical channels are indicated by a, b, c, and d, respectively.

(a) of FIG. 2 illustrates four optical channels a, b, c, and d arranged with a frequency spacing of 200 GHz. (b) of FIG. 2 exemplifies a transmissive characteristic of an existing wavelength tunable filter, and an optical channel that is selected when the existing wavelength tunable filter transmits the frequency indicated by a solid line (at the left side) is the channel a in (c) of FIG. 2. In this case, an optical channel that is selected when the wavelength tunable filter has the transmissive characteristic indicated by a dotted line (at the right side) in (b) of FIG. 2 by changing the temperature is the channel b in (c) of FIG. 2.

In this case, since the spacing between the optical channels is 200 GHz, when a frequency change of the existing wavelength tunable filter is 10 GHz/° C., the temperature of the wavelength tunable filter should changed by 20° C. so that a selective optical wavelength can be changed from the channel a to the channel b.

FIG. 3 is a conceptual diagram illustrating an operation principle of an optical receiver using a Fabry-Perot type etalon filter that transmits a plurality of frequencies according to the present invention.

(a) of FIG. 3 illustrates optical signal frequency distribution of four channels having a frequency spacing of 200 GHz.

On the other hand, assuming that the frequency spacing of the Fabry-Perot type etalon filter applied to the optical receiver according to the present invention is 160 GHz, as indicated by a solid line in (b) of FIG. 3, the transmissive frequency of an etalon filter is turned to the channel a, another transmissive frequency of the etalon filter is not matched with the frequency of another optical channel, so even though an FP type etalon filter has a plurality of transmissive frequency bands, other optical channels cannot pass through the FP type etalon filter.

When the transmissive frequency of the FP type wavelength tunable filter is moved by 40 GHz to achieve the FP type transmissive frequency characteristic indicated by a dotted line in (b) of FIG. 3 by changing the temperature of an FP type etalon filter having the transmissive characteristic indicated by a solid line in (b) of FIG. 3, the optical channel of the channel b is selected. That is, when a frequency change of a wavelength tunable filter is 10 GHz/° C., as in FIG. 2, it is possible to just change the temperature by 4° C. in order to select an adjacent channel in the present invention. Accordingly, it was possible to select a previous channel only by changing temperature by at least 60° C. in existing wavelength tunable filers, but in the present invention, it is possible to select a previous channel even by changing temperature less than 12° C., so energy efficiency can be increased.

In order to described this fact in more detail, it is assumed that the frequencies of the optical channels set in (a) of FIG. 3 are 0 GHz, 200 GHz, 400 GHz, and 600 GHz, respectively, as an embodiment of the present invention. Further, it is assumed that the transmissive frequencies of a wavelength tunable filter that is an FP type etalon filter are . . . −160 GHz, 0 GHz, 160 GHz, 320 GHz, 480 GHz, . . . .

In this case, the channel a (0 GHz) where transmissive frequencies of an optical channel and a wavelength tunable filter are matched is selected. When the temperature of the wavelength tunable filter is increased by 4° C., the transmissive frequency of the wavelength tunable filter is changed by 40 GHz, so the frequencies are changed into −120 GHz, 40 GHz, 200 GHz, 360 GHz, and 520 GHz, and accordingly, the transmissive frequency of the wavelength tunable filter becomes the channel b (200 GHz). Other channels not selected have transmissive frequencies different by at least 40 GHz from the transmissive frequency of an adjacent wavelength tunable filter, so light is blocked.

When the temperature of the wavelength tunable filter is increased again by 4° C., the transmissive frequencies of the wavelength tunable filter are changed into −80 GHz, 80 GHz, 240 GHz, 400 GHz, and 560 GHz, so the transmissive frequency of the wavelength tunable filter becomes the channel c (400 GHz). In this case, other channels not selected have transmissive frequencies different by at least 40 GHz from the transmissive frequency of an adjacent wavelength tunable filter, so light is blocked.

As another embodiment of the present invention, it is assumed that for the frequencies of predetermined optical channels, the channels a, b, c, and d are 0 GHz, 200 GHz, 400 GHz, and 600 GHz, respectively. Further, transmissive frequencies of a wavelength tunable filter that is an FP type etalon filter are . . . −240 GHz, 0 GHz, 240 GHz, 480 GHz, 720 GHz, . . . .

In this case, the channel a (0 GHz) where the transmissive frequencies of the optical channel and the wavelength tunable filter are matched is selected. When the temperature of the wavelength tunable filter is decreased by 4° C., the transmissive frequencies are changed into −280 GHz, −40 GHz, 200 GHz, 440 GHz, and 680 GHz, so the transmissive frequency of the wavelength tunable filter becomes the channel b (200 GHz). In this case, other channels not selected have transmissive frequencies different by at least 40 GHz from the transmissive frequency of an adjacent wavelength tunable filter, so light is blocked.

When the temperature of the wavelength tunable filter is decreased again by 4° C., the transmissive frequencies of the wavelength tunable filter are changed into −320 GHz, −80 GHz, 160 GHz, 400 GHz, and 640 GHz, so the transmissive frequency of the wavelength tunable filter becomes the channel c (400 GHz). In this case, other channels not selected have transmissive frequencies different by at least 40 GHz from the transmissive frequency of an adjacent wavelength tunable filter, so light is blocked.

As described above, assuming that the number of channel of an optical wavelength for a wavelength tunable filter that is an FP type etalon filter according to the present invention is n and the frequency spacing of the considered optical communication channel is dL GHz, when the frequency spacing of the wavelength tunable filter is set by the following Equation 1 or Equation 2, the wavelength spacing between an optical channel that is not supposed to be transmitted and another transmissive frequency of the wavelength tunable filter can be maximized.

$$\frac{n}{(n+1)} \times dL \text{GHz} \quad \text{[Equation 1]}$$

$$\frac{(n+2)}{(n+1)} \times dL \text{GHz} \quad \text{[Equation 2]}$$

However, the frequency spacing of a wavelength tunable filter is not necessarily limited to the equations, and even if there is an error of 10% of the frequency spacing obtained from the equations, it is possible to obtain the effect of blocking other channels when selecting a specific channel that is a desired feature of the present invention.

Further, in the wavelength tunable filter of the related art illustrated in FIG. 2, the position of a transmissive frequency changes in a large range in accordance with the thickness of the spacer illustrated in FIG. 1, so it is very difficult to adjust the transmissive wavelength close to a specific frequency. However, the difference of the transmissive frequency of a manufactured wavelength tunable filter from a specific channel is not over 100 GHz due to the transmissive characteristic of the FP type etalon filter infinitely continued in the present invention. Accordingly, it is possible to easily manufacture an optical receiver using a wavelength tunable filter according to the present invention.

A method of setting a channel spacing of a wavelength tunable filter that can selectively receive a specific wavelength in optical signals having a wavelength spacing of 200 GHz to the channel spacing of incident light signal and the number of channels was described above with reference to FIG. 3. However, the channel spacing of a wavelength tunable filter can be set in other ways, instead of the way illustrated in FIG. 3, and FIG. 4 is a conceptual diagram illustrating a process of selecting a desired optical channel in an optical receiver using a wavelength tunable filter according to another embodiment of the present invention.

Assuming that the number of channels considered in a wavelength tunable filter that is an FP type etalon filter according to the present invention is n and the frequency spacing of a considered optical communication channel is dL GHz, the frequency spacing of the wavelength tunable filter can be set from the following Equation 3.

$$(n+1) \times \frac{dL}{2} \text{GHz} \quad \text{[Equation 3]}$$

FIG. 4 illustrates an operational characteristic when the number of considered optical communication channels is 4, optical communication frequency spacing is 100 GHz, and the frequency spacing of a wavelength tunable filter follows Equation 3. That is, when the number (n) of optical communication channels is 4 and the optical communication frequency spacing (dL) is 100 GHz, the frequency spacing of the wavelength tunable filter illustrated in FIG. 4 is calculated from the following Equation 4.

$$(n+1) \times \frac{dL}{2} \text{GHz} = (4+1) \times \frac{100}{2} \text{GHz} = 250 \text{ GHz} \quad \text{[Equation 4]}$$

A way of selecting a specific frequency from optical communication frequencies of four channels of 100 GHz, using the frequency spacing of 250 GHz of the wavelength tunable filter determined by Equation 4 is as follows. When a wavelength tunable filter selects the frequency of the channel 2 (ch2) at a specific temperature (T=Tref), the difference of an adjacent transmissive frequency band of the wavelength tunable filter from the optical communication frequency band is 50 GHz. Accordingly, other optical communication channels except for the channel 2 cannot pass through the wavelength tunable filter. When the temperature of the wavelength tunable filter is adjusted by T=Tref−5° C., The transmissive frequency of the wavelength tunable filter is moved to 50 GHz, so the channel 2 cannot be transmitted and the frequency of the channel 4 is transmitted. When the temperature of the wavelength tunable filter is adjusted by T=Tref+10° C., the transmissive frequency of the wavelength tunable filter becomes the frequency of the channel 3. When the temperature of the wavelength tunable filter is adjusted by T=Tref−10° C., the transmissive frequency of the wavelength tunable filter is the frequency of the channel 1. Accordingly, the temperature of the wavelength tunable filter is changed by 20° C., so it is possible to select and transmit one frequency of the frequencies of four channels having a spacing of 100 GHz. Accordingly, in order to tune and select four channels having a frequency spacing of 100 GHz using a wavelength tunable filter transmitting one frequency, it is required to change the temperature of a wavelength tunable filter at least by 30° C., but the temperature change range is small, so the amount of consumed energy is decreased.

Meanwhile, the transmissive frequency characteristic of an etalon filter depends on the incident angle of light, so in order to obtain a high signal-noise ratio, it is preferable to collimate laser light traveling into a wavelength tunable filter that is an etalon filter. An optical signal transmitted through an optical fiber diverges out of the optical fiber, and it is preferable to attach a Graded Index lens at the end of the optical fiber to collimate the diverging laser light.

In particular, the laser light collimated and passing through a wavelength tunable filter generally has a diameter of hundreds of um, but the light receiving area of a photodiode receiving light in an optical receiver for high-speed communication is dozens of um at the most, so, as in FIG. 5, it is preferable to use a lens 200 to concentrate laser light passing through a wavelength tunable filter 100 to the light receiving area of a photodiode 300.

Meanwhile, in FIGS. 3 and 4, when any one channel is selected, optical signals of other channels should be blocked and the blocking ratio is determined by sharpness of the transmissive frequency characteristic of an FP type etalon filter. That is, the FP type etalon filter according to an embodiment of the present invention is manufactured by stacking dielectric thin films having high and lower refraction indexes on both sides of a semiconductor substrate made of, for example, silicon, InP, and GaAs. A reflective film is formed on a cross-section of the FP type etalon filter where laser light reaches and the reflective film formed on the cross-section of the FP type etalon filter determines the transmissive frequency characteristic in accordance with the reflectance. The cross-sectional reflectance of the FP type etalon filter is appropriately 80 to 99% in an embodiment of the present invention and preferably 85 to 95%. This is because when the reflectance is low, the transmissive frequency characteristic of a wavelength tunable filter is not rapidly changed, crosstalk is caused at an adjacent channel that is not supposed to be transmitted, and when the cross-sectional reflectance of a wavelength tunable filter is too high, an insertion loss of the wavelength tunable filter is increased. The reflective film of the FP type etalon filter is formed by stacking dielectric thin film having high and low refractive indexes on both side of a semiconductor substrate made of, for example, silicon, InP, and GaAs.

Further, it is preferable to arrange the FP type etalon filter perpendicular to the axis of light traveling into the etalon filter. Accordingly, this is because a transmissive frequency error according to a diverging angle of incident laser light is reduces when the incident light of the light close to a right angle and the noise-to-signal increases. However, when laser light travels into the FP type etalon filter at an accurate right angle, the reflecting components of the incident laser light returns to an optical fiber, so it is preferable to adjust the angle between the incident light of the laser light and the perpendicular line on the cross-section of the FP type etalon filter to 0.2 to 2°, and more preferably adjust the angle between the incident angle of laser light and the perpendicular line on the cross-section of the etalon filter to 0.4 to 1.0°.

Meanwhile, in laser light and a wavelength tunable filter of the related art, the peak of transmissive frequency may have a difference of several nanometers different in design and it is required to additionally adjust temperature at dozens of degrees in order to compensate for the difference with temperature. Accordingly, a transmissive wavelength was adjusted in the related art using an angle by changing the arrangement of a wavelength tunable filter of the related art instead of applying such a large temperature difference. However, since any one of a plurality of etalon transmissive peaks exists in ±80 GHz of a specific wavelength in any cases when the period of an FP type etalon filter is 160 GHz, it is possible to adjust the wavelength of the etalon filter by adjusting temperature by ±8° C. Further, it is possible to tune and transmit all channels by additionally adjusting temperature by 16° C., so it is possible to tune the FP type etalon filter to all channel only by adjusting temperature by 24° C. at the maximum.

Further, a laser light isolator may be disposed between the optical fiber and the FP type etalon filter to prevent the laser light from the optical fiber from reflecting back to the optical fiber from the FP type etalon filter. The isolator means a device that transmits light in only one direction using polarization of light.

Meanwhile, various temperature adjusting units may be considered to change the temperature of the wavelength tunable filter according to the present invention, and for example, it may be possible to mount a heater on a wavelength tunable filter and to arrange a wavelength tunable filter on a thermoelectric element.

Further, the optical receiver including a wavelength tunable filter according to the present invention may be mounted on a package having an external shape of a TO can type package, because the TO can type package is inexpensive, so the manufacturing cost can be reduced.

FIG. 5 is a conceptual diagram illustrating a path of light sent to a photodiode from an optical fiber according to an embodiment of the present invention. As illustrated in FIG. 5, laser light from an optical fiber passes through a wavelength tunable filter 100 at a right angle. The parallel light that has passed through the wavelength tunable filter 100 is focused through a lens 200 and reaches a photodiode 300.

FIG. 6 illustrates a three-dimensional internal structure of a TO (Transistor Outline) type package having the function of an optical receiver using a wavelength tunable filter according to an embodiment of the present invention.

In a TO type package having the function of an optical receiver according to the present invention, the photodiode 300 is attached to the upper surface of a stem base, and the lens 200 and the wavelength tunable filter 100 are disposed over the photodiode. In an embodiment of the present invention, a bridge pier-shaped stand 400 is used to align the lens 200 and the wavelength tunable filter 100 over the photodiode 300. The bridge pier-shaped stand 400 has the shape of bridge piers or desk legs and is made of any one of materials having lower thermal conductivity such as glass and ceramic. The wavelength tunable filter 100 is disposed on the upper surface of the upper part of the bridge pier-shaped stand 400 having the configuration described above and the lens 200 is disposed on the lower surface of the upper part of the bridge pier-shaped stand 400.

A hole is formed at the center of the bridge pier-shaped stand 400 so that laser light from an optical fiber can be collected to the light receiving area of the photodiode 300, and a thin heater film 600 is attached to the upper surface of the bridge pier-shaped stand 400, so heat can be applied to the wavelength tunable filter 100, in which the thin heater film 600 can be adjusted in temperature by a thermistor.

As described above, in an embodiment of the present invention, the wavelength tunable filter 100 on the bridge pier-shaped stand 400 and the lens 200 on the lower surface are arranged in one block so that laser light from an optical fiber can be stably received to the light receiving area of the photodiode 300.

On the other hand, a plurality of electrode pins is formed in stem base of the TO type package illustrated in FIG. 6 and FIG. 7 illustrates a stem structure in a TO can type package according to an embodiment of the present invention.

As illustrated in FIG. 7, a stem 1000 is manufactured by forming a plurality of holes in a stem base 1100 made of metal such as steel or kovar in a cylindrical plate shape and then sealing electrode pins 1300 in the holes with glass sealers 1200. In FIG. 7, a reference numeral '1350' indicates electrode pins for TIA chip data to be described below and a reference numeral '1360' indicates electrode pins for a TIA chip data bar.

The number of the electrode pins 1300 depends on the number of electric elements and the number of necessary electrodes in the TO can type package. However, common optical receivers have a diameter of 6 nm or less, so the area where the electrode pins 1300 can be mounted is limited. The electrode pins 1300 usually have a diameter of 0.2 to 0.4 mm and the width of the glass sealer 1200 made of glass for coupling the electrode pins 1300 and the stem base 1100 has to have a thickness of 0.3 mm or more to ensure stability of the glass sealers 1200.

When several electrode pins 1300 are needed to be arranged in the stem base 1100 of the TO type package due to external structural limits, the electrode pins should be arranged in a specific type due to the number of the electrode pins 1300 and necessary characteristics of the electrode pins 1300.

FIG. 8 illustrates the structure of a wavelength tunable optical receiver having a built-in thermoelectric element on a stem base of a TO type package according to an embodiment of the present invention.

As illustrated in FIG. 8, a thermoelectric element 200 is disposed at a side on the upper surface of the stem base 1100 and a thermistor 2100 that can measure the temperature of an APD chip 3000 and the thermoelectric element 200 is attached to a side on the upper surface of the thermoelectric element 2000. A wavelength tunable filter 6000 that is in thermal contact with the thermoelectric element 200 and is supported by a support member that can support the wavelength tunable filter 6000 but is not illustrated in the figure is disposed on the APD (Avalanche Photo Diode) chip 3000. A TIA (Trans Impedance Amplifier) chip 400 is disposed at a side of the thermoelectric element 2000 and is disposed on a metal stand 5000 that receives electrode pin in holes formed therein but not illustrated in the figure. The metal stand 5000 is disposed on the stem base 1100.

For the configuration of the present invention described above, there is a need for electrode pins electrically insulated from the stem base 1100 having eight electrodes of 1) a thermoelectric element +, 2) a thermoelectric element −, 3) A thermistor, 4) an APD chip bias electrode, 5) a TIA chip VCC, 6) a TIA chip data, 7) a TIA chip data bar, and 8) a TIA chip Vmon. In some cases, the TIA chip Vmon may be omitted. The "thermoelectric element +" and "thermoelectric element −" are electrodes for heating or cooling the thermoelectric element 2000 by applying electricity to the thermoelectric element 2000 and the thermistor electrode pin is an electrode pin for receiving a signal of the thermistor 2100 that is an element measuring the temperature of the upper plate of the thermoelectric element 2000. Further, the APD chip bias electrode is an electrode pin for applying dozens of voltage to an APD chip 3000 to operate the element and Vcc is an electrode pin for applying power to the TIA chip 4000 in a package. Data is usually outputted from the TIA chip 4000 in a differential voltage type of a + voltage that is a data signal and a − voltage opposite to the + voltage, so an APD chip data electrode pin and an APD chip data bar electrode pin are needed. The Vmon is an electrode pin monitoring a current flowing to the APD chip 3000.

It is preferable that the TIA chip data and the TIA chip data bar electrode pin of the seven or eight electrode pins are matched at 50 ohm in impedance and it is preferable that they are separately coupled to the stem base 1100 by the glass sealers 1200 to remove noise.

As described above, the size of the optical element for NG-PON2 is currently limited within a 6 mm diameter. It is preferable that electrode pins are arranged as circularly as possible around the central axis of the stem base 1100. The thickness of rib of the stem base 1100 between the glass sealers 1200 is preferably 0.5 mm or more. Accordingly, heat generated by the thermoelectric element 2000 is effectively discharged.

FIG. 9 illustrates an example of arrangement when eight electrode pins are independently sealed by eight glass sealers. Eight ribs of the stem base 1100 are supposed to exist between eight glass sealer 1200, so the gap between the glass sealers 1200, and accordingly, it is difficult to effectively discharge heat from elements in the TO package such as the thermoelectric element 2000. Accordingly, seven or eight electrode pins 1300 sealed by glass having a predetermined size or more are disposed in the small package, and there is a need for a specific way of independently sealing at least two electrode pins 1300 with the glass sealer 1200, reducing the number of the glass sealer 1200, and arranging the electrode pins 300 as circularly as possible around the center of the TO package.

In FIG. 7, arrangement of electrode pins for satisfying characteristics required in the present invention is illustrated. Eight electrode pins 1300 are sealed by five glass sealers 1200, that is, at least two or more electrode pins 1350 and 1360 are sealed by independent glass sealer 1200, and six electrode pins 1300 are distributed by three glass sealers 1200, in which two electrode pins 1300 are sealed by one glass sealer 1200. This arrangement can maximize the distance between the glass sealers 1200, so heat can be easily discharged. Further, the electrode pins 1300 are arranged circularly around the center of the stem 1000, so the connection between each element and the electrode pins 1300 is excellent. Further, two electrode pins 1350 and 1360 are sealed by independent glass sealers 1200, so they are used as electrode pins for TIA data and TIA data bar requiring high transmission quality. In an embodiment of the present invention, a case electrode pin may be mounted in the stem base 1100.

As described above, although a way of adjusting temperature using a thermoelectric element 2000 is proposed as the most effective way of using the present invention in the embodiment of the present invention, a way of adjusting temperature of the wavelength tunable filter 6000 using a heater may be implemented by the electrode pin structure proposed in the present invention. The heater may be operated by one electrode pin 1300 and common grounding wires simultaneously applied to several elements, so seven electrode pins 1300 are needed to be arranged in this case. In this case, five glass sealers 1200 are used, three electrode pins 1300 are independently sealed by the glass sealers 1200, and four electrode pins are sealed in a set of two by one glass sealer 1200.

In FIG. 7, the TIA data electrode pin 1350 and the TIA data bar electrode pin 1360 are divided into electrode pin areas at the portion sealed by the glass sealer 1200 and the portion protruding in the TO type package. In this case, the portion of the TIA data electrode pin 1350 that is sealed by the glass sealer 1200 can be easily matched at 50 ohm in impedance, but the electrode portion protruding in the TO package is difficult to match in impedance. The impedance of the electrode pin portions protruding in the TO package of the TIA data electrode pin 1350 and the TIA data bar electrode pin 1360, which are electrode pins for transmitting signals, can be effectively matched at 50 ohm by attaching the metal stand 5000 having holes therein as illustrated in FIG. 10, so high-speed operation in 10 Gbps class is possible.

In FIG. 8 illustrating an example of a wavelength tunable optical receiver including the thermoelectric element described above, the holes and the glass sealers in the stem base 1100, the electrode pins, and the holes in the metal stand 5000 are not illustrated to simply describe the figure. However, it is apparent that there are holes and electrode pins sealed by glass sealers are in the stem base 1100, and it is also apparent that there are holes in the metal stand 5000 and electrode pins are inserted in the holes.

In FIG. 8, the thermoelectric element 2000 is disposed at a side on the upper surface of the stem base 1100, the APD chip 3000 is disposed at a side on the upper surface of the thermoelectric element 2000, and the wavelength tunable filter 6000 is supported by a wavelength tunable filter support member (not illustrated) on the upper surface of the APD chip 3000, which was described above with reference to FIG. 8. Light 9000 with a wavelength passing through the wavelength tunable filter 6000 travels into the light receiving area of the APD chip 3000 under the wavelength tunable filter 6000 and an electric signal corresponding to the received light is transmitted to the TIA chip 4000. Light 9100 having a wavelength reflecting from the wavelength tunable filter 6000 reflects from the wavelength tunable filter 6000, so it cannot travel into the APD chip 3000.

In general, the thermoelectric element 2000 is about 1 mm high and the APD chip 3000 is disposed on the thermoelectric element 2000, so the height of the APD chip 3000 is about 1.2 mm. When the TIA chip 4000 is bonded to the upper surface of the stem base 1100, a large height difference is generated between the APD chip 3000 and the TIA chip 4000, so a severe signal loss is caused in the process of connecting an electric signal of the APD chip 3000 to the TIA chip 4000 due to Au wire. The TIA chip 4000 generates a large amount of heat, about 300 mW, so when it is disposed on the thermoelectric element 2000, the thermoelectric element 2000 cannot resist the thermal load and correspondingly loses its function. This problem can be solved by disposing the TIA chip 4000 on the metal stand 5000. The metal stand 5000 allows the TIA chip 4000 to be positioned at a height similar to the APD chip 3000 on the thermoelectric element 2000, so the APD chip 3000 and the TIA chip 4000 can be positioned closest to each other, and accordingly a loss of signals can be reduced. The heat from the TIA chip 400 is effectively discharged to the outside through the stem base 1100, because the TIP chip is disposed on the metal stand 5000 made of metal having high thermal conductivity. The metal stand 5000 allows for smooth high-speed transmission by matching impedance of the TIA transmission signal electrode pins 1350 and 1360 through the holes therein.

Accordingly, as in an embodiment of the present invention, the distance between the APD chip 3000 and the TIA chip 4000 is minimized and the signal quality is improved by forming seven or eight electrode pins 1300 in the stem base 1100 having five holes, arranging the thermoelectric element 2000, the wavelength tunable filter 3000 transmitting different wavelengths in accordance with temperature, the APD chip 3000, and the TIA chip 4000, and arranging the TIA chip 4000 on the metal stand 5000. Further, since the metal stand 500 has holes, the quality of signals transmitted to the electrode pins 1350 and 1360 is improved by matching the impedance of the electrode pins 1350 and 1360 inserted in the holes of the metal stand 5000 at a predetermined value.

On the other hand, although two holes are formed in one metal stand 5000 to match impedance of two electrodes 1350 and 1360 in the embodiment of the present invention, it may be possible to fit two metal stands each having one hole into signal transmission electrode pins 1350 and 1360. Further, although an example of receiving light using one APD chip 3000 was described in the embodiment of the present invention, it may be achieved even using a photodiode having a PIN structure instead of the APD chip 3000.

Although it was described in the embodiment of the present invention that the wavelength tunable filter 6000 is fixed to the upper surface of the thermoelectric element 2000 by a support member, materials having a small expansion ratio according to temperature and having high thermal conductivity are suitable for the support member for a wavelength tunable filter and those materials may be silicon or an AIN substrate.

The present invention is not limited to the embodiments described above and it should be understood that the present invention may be changed and modified in various ways by those skilled in the art within a range equivalent to the spirit of the present invention and claims to be described below.

The invention claimed is:

1. A wavelength tunable optical receiver comprising:
   a stem base;
   a thermoelectric element being disposed on an upper surface of the stem base;
   a wavelength-tunable wavelength-selective filter being disposed on the thermoelectric element, passing through a specific wavelength of laser light from an optical fiber in a direction of the stem base, and transmitting different wavelengths in accordance with a temperature of the thermoelectric element;
   a lens converting parallel light passing through and emitted from the wavelength-tunable wavelength-selective filter into converging light; and
   the lens being disposed between the wavelength-tunable wavelength-selective filter and a photodiode to focus and converge the parallel light onto a converging light receiving area of the photodiode;
   wherein the laser light from the optical fiber and an axis extending normal to a plane, defined by the wavelength-tunable wavelength-selective filter, form an angle of 0.2 to 2° therebetween for preventing incident laser light from being reflected back to the optical fiber.

2. The optical receiver of claim 1, wherein the photodiode is disposed on the upper surface of the thermoelectric element,
   the wavelength-tunable wavelength-selective filter passing through the specific wavelength of laser light from an optical fiber in a direction of the lens,
   the wavelength-tunable wavelength-selective filter is disposed upstream of the lens,
   the lens, the photodiode and the wavelength-tunable wavelength-selective filter are vertically disposed on the stem base.

3. The optical receiver of claim 1, the photodiode receives laser light passing through the wavelength-tunable wavelength-selective filter.

4. The optical receiver of claim 1, wherein when a number of optical channels is n, and a frequency spacing of the wavelength-tunable wavelength-selective filter is determined by:
(n/(n+1)×optical channel frequency spacing) or ((n+2)/(n+1)×optical channel frequency spacing).

5. The optical receiver of claim 1, wherein when the number of optical channels is n, and a frequency spacing of the wavelength-tunable wavelength-selective filter is determined within ±10% of:
(n/(n+1)×optical channel frequency spacing) or ((n+2)/(n+1)×optical channel frequency spacing).

6. The optical receiver of claim 1, wherein when the number of optical channels is n, and a frequency spacing of the wavelength-tunable wavelength-selective filter is determined by:
((n+1)×optical channel frequency spacing/2).

7. The optical receiver of claim 4, wherein the number of optical channels n is 4 or 8.

8. The optical receiver of claim 1, wherein the wavelength-tunable wavelength-selective filter has a reflective film formed by stacking thin dielectric films, including any one of silicon, InP, and GaAs, which have high and lower refractive indexes on both sides of a semiconductor substrate.

9. The optical receiver of claim 1, a line perpendicular to a cross-section of the wavelength-tunable wavelength-selective filter, where laser light reaches, and incident laser light form an angle therebetween of 0.4 to 1°.

10. The optical receiver of claim 1, wherein an isolator transmitting light in only one direction is disposed between the optical fiber and the wavelength-tunable wavelength-selective filter.

11. The optical receiver of claim 1, wherein the wavelength-tunable wavelength-selective filter is disposed on an upper surface of a bridge pier-shaped stand and the photodiode is disposed under the bridge pier-shaped stand.

12. The optical receiver of claim 11, wherein a thin heater film, for adjusting a temperature of the wavelength-tunable wavelength-selective filter, is disposed on the upper surface of the bridge pier-shaped stand.

13. The optical receiver of claim 11, wherein a thermistor, for measuring a temperature of the wavelength-tunable wavelength-selective filter, is also disposed at a side of the upper surface of the bridge pier-shaped stand.

14. The optical receiver of claim 2, wherein the stem base has a TO type package structure with at least seven or more insulated electrode pins, and the electrode pins are sealed by five or more glass sealers, and
at least two or more electrode pins are independently sealed by independent glass sealers, and a set of two electrode pins are sealed by at least one glass sealer.

15. The optical receiver of claim 2, wherein five holes are formed in the stem base, one electrode pin is sealed in two of the five holes by the glass sealers and two electrode pins are sealed in each of three of the five holes by one glass sealer.

16. The optical receiver of claim 2, wherein five holes are formed in the stem base, and
one electrode pin is sealed in each of three of the five holes by the glass sealers and two electrode pins are sealed in each of two of the five holes by one glass sealer.

17. The optical receiver of claim 2, wherein electrode pins, used as high-speed signal transmission wires, are inserted in holes formed in a metal stand.

18. The optical receiver of claim 17, wherein a TIA (Trans Impedance Amplifier) chip is disposed on the upper surface of the metal stand.

19. The optical receiver of claim 2, wherein the photodiode is an APD (Avalanche Photo Diode) chip.

20. The optical receiver of claim 2, wherein the stem base has eight insulated electrode pins sealed by glass sealers, the insulated electrode pins are a thermoelectric element +, a thermoelectric element −, a thermistor, an APD (Avalanche Photo Diode) chip bias, a TIA (Trans Impedance Amplifier) chip Vcc, TIA chip data, a TIA chip data bar, and a TIA chip Vmon electrode.

* * * * *